US012787845B2

(12) United States Patent
Yang

(10) Patent No.: US 12,787,845 B2
(45) Date of Patent: Nov. 3, 2026

(54) MANUFACTURING METHOD FOR A DIE INCLUDING FORMING A COPPER LAYER USING ELECTROLESS PLATING WITH ZINC DISPLACEMENT REACTION

(71) Applicant: CR RUNAN TECHNOLOGIES (CHONGQING) CO. LTD., Chongqing (CN)

(72) Inventor: Weiyuan Yang, Chongqing (CN)

(73) Assignee: CR RUNAN TECHNOLOGIES (CHONGQING) CO. LTD., Chongqing (CN)

( * ) Notice: Subject to any disclaimer, the term of this patent is extended or adjusted under 35 U.S.C. 154(b) by 719 days.

(21) Appl. No.: 18/020,349

(22) PCT Filed: Nov. 16, 2021

(86) PCT No.: PCT/CN2021/130874
§ 371 (c)(1),
(2) Date: Feb. 8, 2023

(87) PCT Pub. No.: WO2022/134940
PCT Pub. Date: Jun. 30, 2022

(65) Prior Publication Data
US 2023/0268299 A1 Aug. 24, 2023

(30) Foreign Application Priority Data
Dec. 23, 2020 (CN) ......................... 202011540576.9

(51) Int. Cl.
*H01L 23/498* (2006.01)
*G11C 5/06* (2006.01)
(Continued)

(52) U.S. Cl.
CPC ....... *H10W 74/016* (2026.01); *H10W 74/473* (2026.01); *H10W 72/019* (2026.01); *H10W 72/9415* (2026.01); *H10W 72/952* (2026.01)

(58) Field of Classification Search
CPC . H01L 23/31; H01L 23/3157; H01L 23/3135; H01L 2224/0231–024;
(Continued)

(56) References Cited

U.S. PATENT DOCUMENTS 2,662,831 A * 12/1953 Culverhouse, Jr. ...... C25D 5/44 205/185
3,672,976 A * 6/1972 Kallenbach ............. C23C 18/38 427/436
(Continued)

FOREIGN PATENT DOCUMENTS

CN 1971903 A 5/2007
CN 101471356 A 7/2009
(Continued)

*Primary Examiner* — Wael M Fahmy
*Assistant Examiner* — Aneesa Riaz Baig
(74) *Attorney, Agent, or Firm* — MUNCY, GEISSLER, OLDS & LOWE, P.C.

(57) ABSTRACT

The present disclosure provides a die, a manufacturing method of the die, a chip packaging structure and a manufacturing method of the chip packing structure. The die includes an aluminum bonding pad, a passivation layer and a copper layer. The aluminum bonding pad and the passivation layer are both on an active surface of the die, and the passivation layer has a first opening in which the aluminum bonding pad is partially exposed. The copper layer is on the aluminum bonding pad and covers a part of the aluminum bonding pad. A boundary of the copper layer is spaced apart from the passivation layer at a boundary of the first opening by a distance. Since the copper layer covers a part of the aluminum bonding pad, and the boundary of the copper
(Continued)

layer is spaced apart from the passivation layer by a distance, the copper layer is completely received in the opening in the passivation layer.

8 Claims, 7 Drawing Sheets

(51) Int. Cl.

| | |
|---|---|
| ***H01L 21/768*** | (2006.01) |
| ***H01L 23/00*** | (2006.01) |
| ***H01L 23/495*** | (2006.01) |
| ***H10B 51/10*** | (2023.01) |
| ***H10B 51/20*** | (2023.01) |
| ***H10H 20/80*** | (2025.01) |
| ***H10H 20/852*** | (2025.01) |
| ***H10H 20/855*** | (2025.01) |
| ***H10H 20/856*** | (2025.01) |
| ***H10H 20/857*** | (2025.01) |
| ***H10W 72/00*** | (2026.01) |
| ***H10W 72/90*** | (2026.01) |
| ***H10W 74/01*** | (2026.01) |
| ***H10W 74/47*** | (2026.01) |
| ***H10W 90/00*** | (2026.01) |

(58) Field of Classification Search

CPC ......... H01L 23/49838; H01L 23/49822; H01L 23/49866; H01L 21/4853; H01L 21/4857; H01L 2224/0381; H01L 2224/022–02215; H01L 2224/0391; C23C 18/38

See application file for complete search history.

(56) References Cited

U.S. PATENT DOCUMENTS

| | | | | |
|---|---|---|---|---|
| 5,310,699 | A | 5/1994 | Chikawa et al. | |
| 6,251,804 | B1 * | 6/2001 | Chen | H01L 21/02118 257/E21.301 |
| 6,426,545 | B1 * | 7/2002 | Eichelberger | H01L 23/3157 257/E23.129 |
| 6,506,672 | B1 * | 1/2003 | Dagenais | H01L 21/288 257/E21.174 |
| 12,132,022 | B2 * | 10/2024 | Fan | H01L 23/3171 |
| 2005/0074959 | A1 * | 4/2005 | Burrell | H01L 23/53223 257/E23.134 |
| 2006/0073638 | A1 | 4/2006 | Hsu | |
| 2007/0085224 | A1 * | 4/2007 | Kouno | H01L 23/3114 257/E23.021 |
| 2012/0129333 | A1 * | 5/2012 | Yim | H01L 24/13 257/E21.586 |
| 2015/0076110 | A1 * | 3/2015 | Wu | C23F 4/00 216/67 |
| 2017/0179057 | A1 * | 6/2017 | Tan | H01L 23/3171 |
| 2021/0125950 | A1 * | 4/2021 | Hisada | H10W 72/073 |

FOREIGN PATENT DOCUMENTS

| | | | | |
|---|---|---|---|---|
| CN | 103035604 A | | 4/2013 | |
| CN | 105448829 A | | 3/2016 | |
| CN | 105575825 A | * | 5/2016 | H01L 24/81 |
| CN | 108511401 A | | 9/2018 | |
| CN | 109427718 A | | 3/2019 | |
| CN | 110649055 A | | 1/2020 | |
| CN | 113113383 A | | 7/2021 | |
| EP | 2756116 B1 | * | 5/2016 | C25D 5/605 |

* cited by examiner

MANUFACTURING METHOD FOR A DIE INCLUDING FORMING A COPPER LAYER USING ELECTROLESS PLATING WITH ZINC DISPLACEMENT REACTION

TECHNICAL FIELD

The present disclosure relates to the technical field of chip packaging and, in particular, to a die and a manufacturing method therefor, and a chip packaging structure and a manufacturing method therefor.

BACKGROUND

In recent years, with continuous development of circuit integration technology, electronic products keep developing toward miniaturization, intelligence, high integration, high performance and high reliability. Packaging technology not only limits miniaturization but also affects performance of such products.

In view of this, the present disclosure provides a die and a manufacturing method therefor, and a chip packaging structure and a manufacturing method therefor, which enable improved yield of package structures.

SUMMARY OF THE INVENTION

The present disclosure provides a die and a manufacturing method therefor, a chip packaging structure and a manufacturing method therefor, which enable improved yield of package structures.

Accordingly, in a first aspect of the present disclosure, there is provided a die, comprising: an aluminum bonding pad and a passivation layer, both on an active surface of the die, the passivation layer having a first opening in which the aluminum bonding pad is partially exposed; and a copper layer that is on the aluminum bonding pad and covers a part of the aluminum bonding pad, wherein a boundary of the copper layer is spaced apart from the passivation layer at a boundary of the first opening by a distance.

In a second aspect of the present disclosure, there is provided a manufacturing method for a die, comprising: providing a wafer comprising a passivation layer and a plurality of aluminum bonding pads, both on an active surface of the wafer, the passivation layer having a plurality of first openings in which the aluminum bonding pads are partially exposed; forming a patterned mask layer over the passivation layer and the plurality of aluminum bonding pads, the patterned mask layer having second openings in which the aluminum bonding pads are partially exposed, the patterned mask layer completely covering the passivation layer; removing an oxide layer from the aluminum bonding pads, forming a copper layer in the second openings and removing the patterned mask layer; and dicing the wafer into a plurality of dies.

In a third aspect of the present disclosure, there is provided a chip packaging structure, comprising: the die according to the above first aspect; a plastic encapsulation layer encapsulating the die; and a pin on the plastic encapsulation layer, the pin filling a through hole in the plastic encapsulation layer so as to be connected to the copper layer.

In a fourth aspect of the present disclosure, there is provided a manufacturing method for a chip packaging structure, comprising: providing a die manufactured according to the above second aspect and forming a plastic encapsulation layer encapsulating the die; forming a through hole, in which the copper layer is exposed, in the plastic encapsulation layer by laser drilling; forming a pin over the plastic encapsulation layer and the copper layer; and forming the chip packaging structure by dicing.

As the copper layer is formed on a part of the aluminum bonding pad, with its boundary being spaced apart from the passivation layer by a distance, the copper layer is totally received in the opening in the passivation layer. Firstly, compared with the case where the copper layer is partially raised over the passivation layer, this can avoid the risk of the copper layer falling off the passivation layer due to poor adhesion between them. Secondly, the copper layer can prevent surface oxidation of the aluminum bonding pad, which may lead to an increase in the electrical resistance of the aluminum bonding pad. Thirdly, in case of the opening in the plastic encapsulation layer being formed by laser drilling, the copper layer may avoid perforation of the aluminum bonding pad due to excessively laser energy, resulting in larger process margins and higher yield of packaging structures.

The details of one or more embodiments of the application are set forth in the accompanying drawings and the description below. Other features, objects, and advantages of the application will be apparent from the description and drawings, and from the claims.

Figure 1:
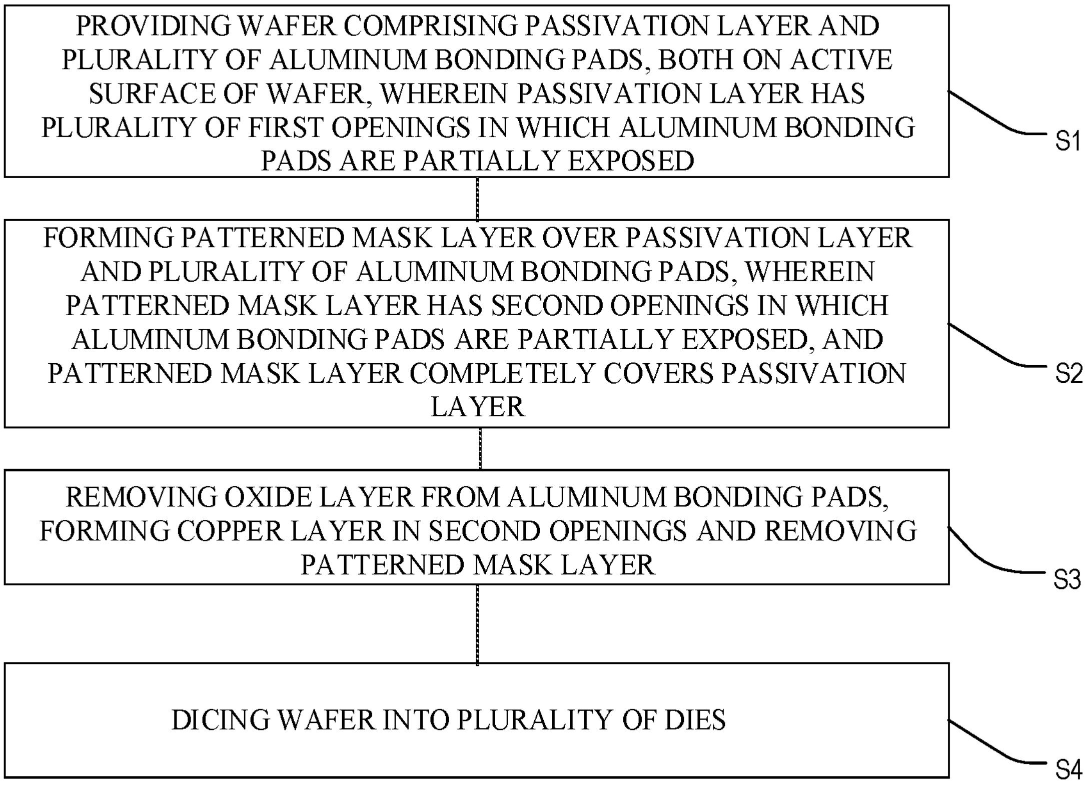
FIG. 1 shows a flow diagram of a manufacturing method for a die according to a first embodiment of the present disclosure.

For a better understanding of the present disclosure, a list of reference numerals used herein is given below.

| | | | |
|---|---|---|---|
| 11 | Wafer | 111 | Passivation Layer |
| 112 | Aluminum Bonding Pad | 11a | Active Surface of Wafer |
| 111a | First Opening | 11b | Backside of Wafer |
| 20a | Second Opening | 20 | Patterned Mask Layer |
| 1 | Die | 113 | Copper Layer |
| 21 | Plastic Encapsulation Layer | 1a | Active Surface of Die |
| 21b | Backside of Plastic Encapsulation Layer | 21a | Front Side of Plastic Encapsulation Layer |
| 211 | Through Hole | 2 | Carrier Substrate |
| 23 | Rewiring Layer | 22 | Pin |
| 3, 4 | Chip Packaging Structure | 24 | Dielectric Layer |

DETAILED DESCRIPTION

The above objects, features and advantages of the present disclosure will become apparent from the following detailed description, which, taken in conjunction with the accompanying drawings, discloses preferred embodiments of the disclosure.

Figure 6:
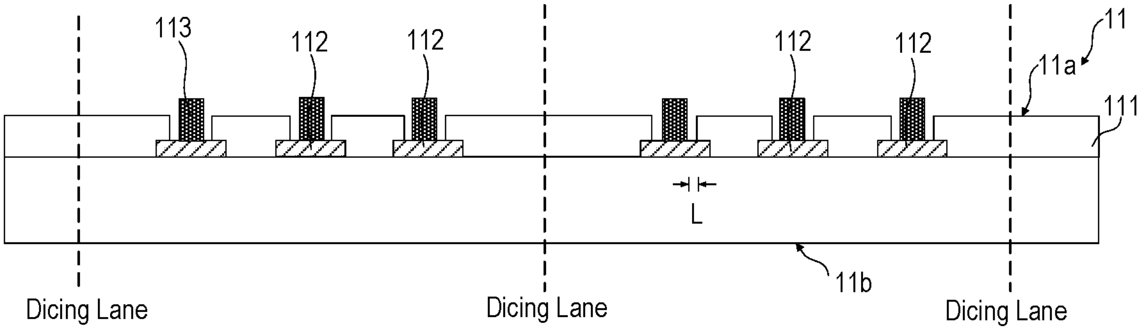
Figure 7:
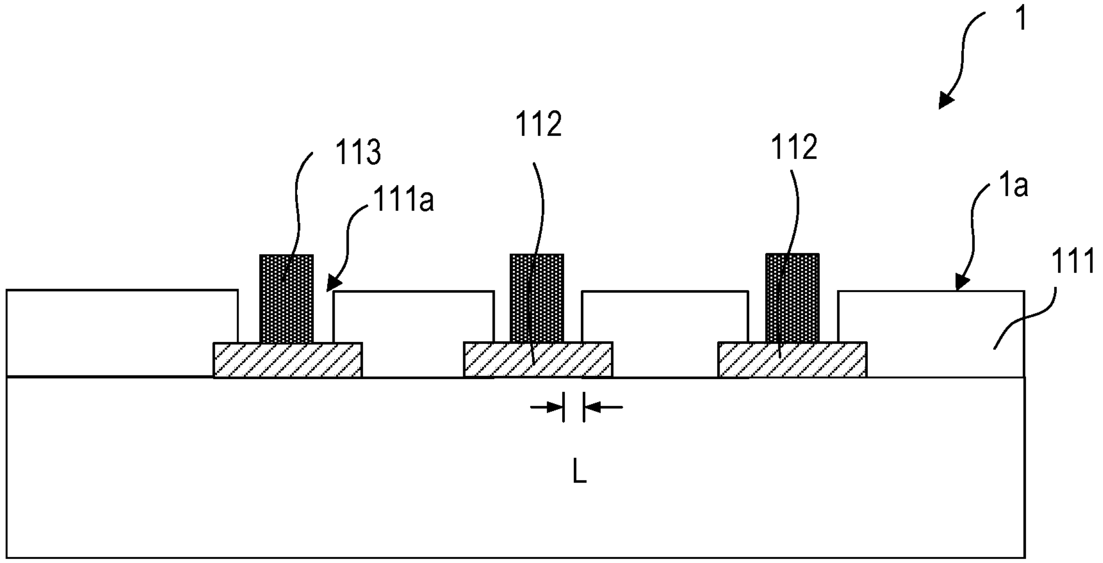
FIG. 7 is a schematic cross-sectional diagram showing the structure of a die according to the first embodiment of the present disclosure.

FIG. 1 shows a flow diagram of a manufacturing method for a die according to a first embodiment of the present disclosure. FIGS. 2 to 6 are schematic diagrams of intermediate structures formed in the method of FIG. 1. FIG. 7 is a schematic cross-sectional diagram showing the structure of a die according to the first embodiment of the present disclosure.

Figure 2:
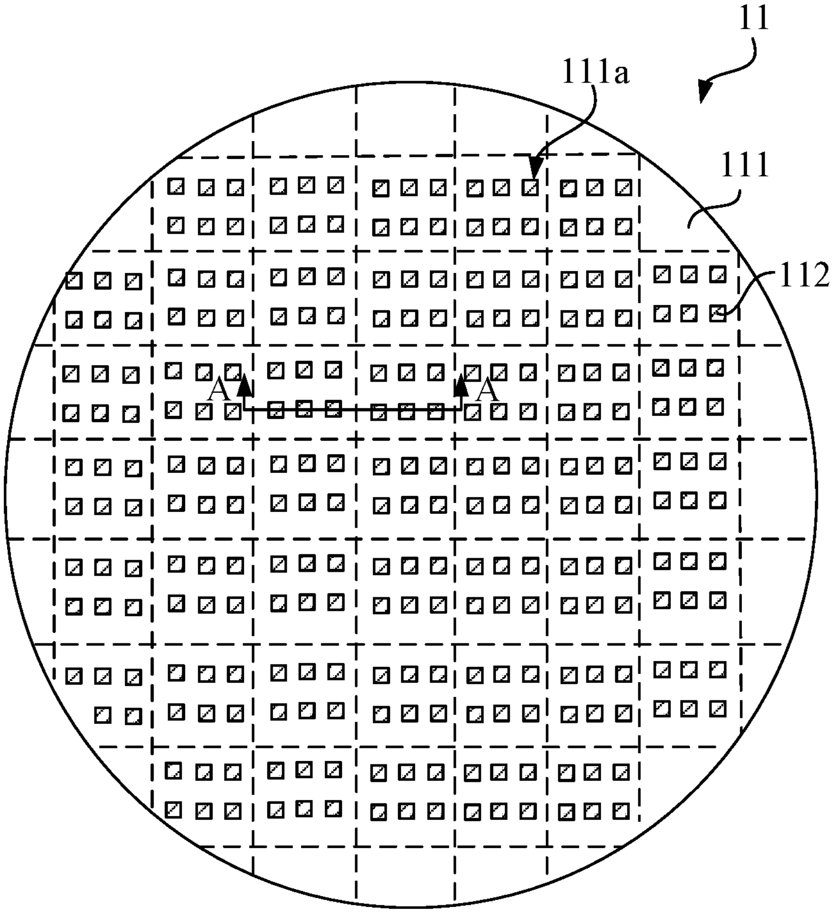
FIGS. 2 to 6 are schematic diagrams of intermediate structures formed in the method of FIG. 1.
Figure 3:
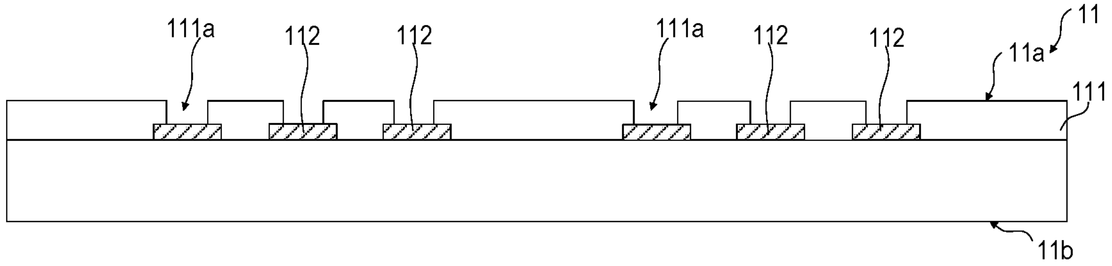

Reference is first made to step S1 shown in FIG. 1, as well as to FIGS. 2 and 3. FIG. 2 is a top view of a wafer, and FIG. 3 is a cross-sectional view taken along line AA in FIG. 2. In this step, the wafer 11 is provided, which includes a passivation layer 111 and a plurality of aluminum bonding pads 112. The passivation layer 111 and the aluminum bonding pads 112 are all on an active surface 11*a* of the wafer 11. In the passivation layer 111, a plurality of first openings 111*a* are formed, in which the aluminum bonding pads 112 are partially exposed.

Referring to FIG. 2, the wafer 11 may include an array of regions, each of which may include various devices formed on a semiconductor substrate, as well as electrical interconnects in electrical connection with the devices. The aluminum bonding pads 112 are connected to the electrical interconnects in order to input/output electrical signals to/from the devices.

The aluminum bonding pads 112 may have a thickness smaller than 3 μm. For example, it may be smaller than 1 μm.

The passivation layer 111 may be formed of a dense material such as silicon nitride, which can prevent access of moisture, oxygen or other foreign matter to the devices on the semiconductor substrate.

The first openings 111*a* in the passivation layer 111 may be formed by dry or wet etching.

Figure 4:
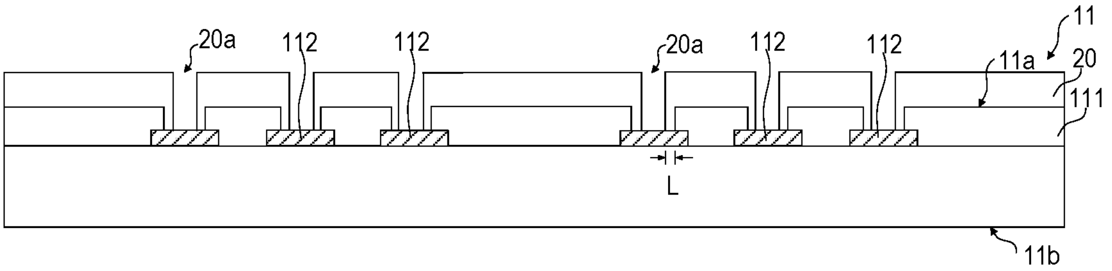

Next, referring to step S2 shown in FIG. 1, as well as to FIG. 4, a patterned mask layer 20 is formed over the passivation layer 111 and the aluminum bonding pads 112. The patterned mask layer 20 has second openings 20*a*, in which the aluminum bonding pads 112 are partially exposed. Moreover, the patterned mask layer 20 completely covers the passivation layer 111.

The patterned mask layer 20 may be formed of photoresist. In one optional embodiment, the photoresist layer formed may be a photosensitive film. The photosensitive film may be torn from a tape and attached onto the passivation layer 111 and the aluminum bonding pads 112. In an alternative embodiment, the photoresist layer may be formed by heating and curing applied liquid photoresist. The patterned mask layer 20 may be alternatively formed of a dielectric material that is different from the material of the passivation layer 111. For example, in case of the passivation layer 111 being formed of silicon nitride, the patterned mask layer 20 may be formed of, for example, silicon dioxide.

Optionally, prior to the formation of the patterned mask layer 20, the passivation layer 111 may be bombarded with oxygen plasma or argon plasma in order to enhance adhesion between the passivation layer 111 and the patterned mask layer 20.

The complete covering of the passivation layer 111 by the patterned mask layer 20 means that the second openings 20*a* are sized smaller than the first openings 111*a*. A boundary of the second openings 20*a* is spaced apart from a boundary of the first openings 111*a* by a distance L. Preferably, the distance L ranges from 3 μm to 10 μm.

It is to be noted that the range in this embodiment includes the endpoint values.

Figure 5:
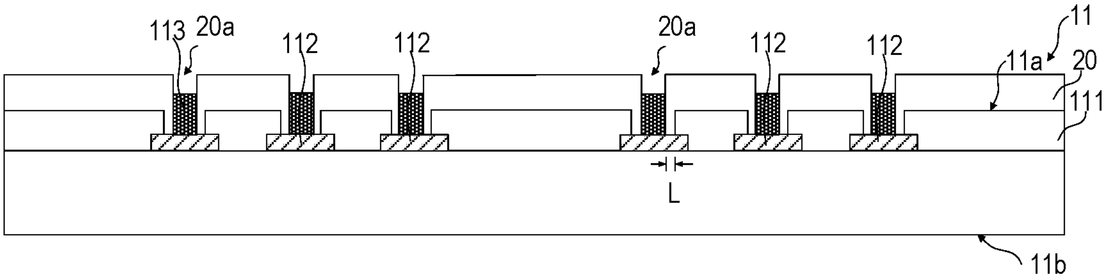

After that, referring to step S3 shown in FIG. 1, as well as to FIGS. 4 and 5, an oxide layer on the aluminum bonding pads 112 is removed, and a copper layer 113 is formed in the second openings 20*a*. Referring to FIG. 6, the patterned mask layer 20 is removed.

Subsequent to the formation of the first openings 111*a* and the second openings 20*a*, the aluminum bonding pads 112 are exposed in the surround environment and may be oxidized by oxygen in the environment, and a layer of aluminum oxide may develop, which has an electrical resistance much higher than that of aluminum and thus leads to an increase in the electrical resistance of the aluminum bonding pads 112.

Such an increase in the electrical resistance can be avoided by removing the oxide layer formed on the aluminum bonding pads 112.

In particular, the removal of the oxide layer on the aluminum bonding pads 112 may be accomplished by a micro-etching process in which an acidic etching solution, for example, a sulfuric, hydrochloric or nitric acid solution, may react with and thus remove the oxide layer.

The copper layer 113 may be formed by electroless plating.

Electroless plating is a process in which metal ions are reduced, resulting in precipitation of a layer of the metal over an object being plated.

In the electroless plating process, a) the wafer 11 that has undergone oxide layer removal is placed in a solution containing copper ions. A displacement reaction then takes place between aluminum and copper ions, resulting in a copper layer 113 precipitated on the aluminum bonding pads 112. Alternatively, b) the wafer 11 that has undergone oxide layer removal is first placed in a solution containing zinc ions, and a displacement reaction then takes place between aluminum and zinc ions, resulting in a zinc layer precipitated on the aluminum bonding pads 112. Subsequently, the zinc-plated wafer 11 is placed in a solution containing copper ions, and a displacement reaction then takes place between zinc and copper ions, resulting in a copper layer 113 precipitated on the aluminum bonding pads 112. Compared with the solution a), the solution b) is advantageous at least in that the zinc layer can reduce surface roughness of the aluminum bonding pads 112, thus enabling the resulting copper layer 113 to have a flatter surface.

A top surface of the copper layer 113 may be either higher or lower than a top surface of the passivation layer 111. Considering it will be exposed to laser energy used in the subsequent laser drilling process, the copper layer 113 is preferred to be thick.

The copper layer 113 is completely received in the openings 111*a* in the passivation layer 111. Compared with the case where the copper layer 113 is partially raised over the passivation layer 111, this can avoid the risk of the copper layer 113 falling off the passivation layer 111 due to poor adhesion between them.

The patterned mask layer 20 may be removed by a specific process. For example, the photoresist may be ashed away. The photosensitive film may be removed using an acidic solution. Silicon dioxide may be removed using hydrofluoric acid.

Afterwards, referring to step S4 shown in FIG. 1, as well as to FIGS. 6 and 7, the wafer 11 is diced into a plurality of dies 1.

Before the wafer 11 is diced, it may undergo a thinning process on its backside 11*b*, resulting in a reduced thickness of the resulting dies 1.

Referring to FIG. 7, in the present embodiment, each die 1 includes:

- aluminum bonding pads 112 and a passivation layer 111, both on an active surface 1*a* of the die 1, the passivation layer 111 having first openings 111*a* in which the aluminum bonding pads 112 are partially exposed; and
- a copper layer 113 on the aluminum bonding pads 112 so as to cover a part of the aluminum bonding pads 112, wherein a boundary of the copper layer 113 is spaced apart from the passivation layer 111 at a boundary of the first openings 111*a* by a distance L.

Preferably, the distance L ranges from 3 μm to 10 μm.

Figure 8:
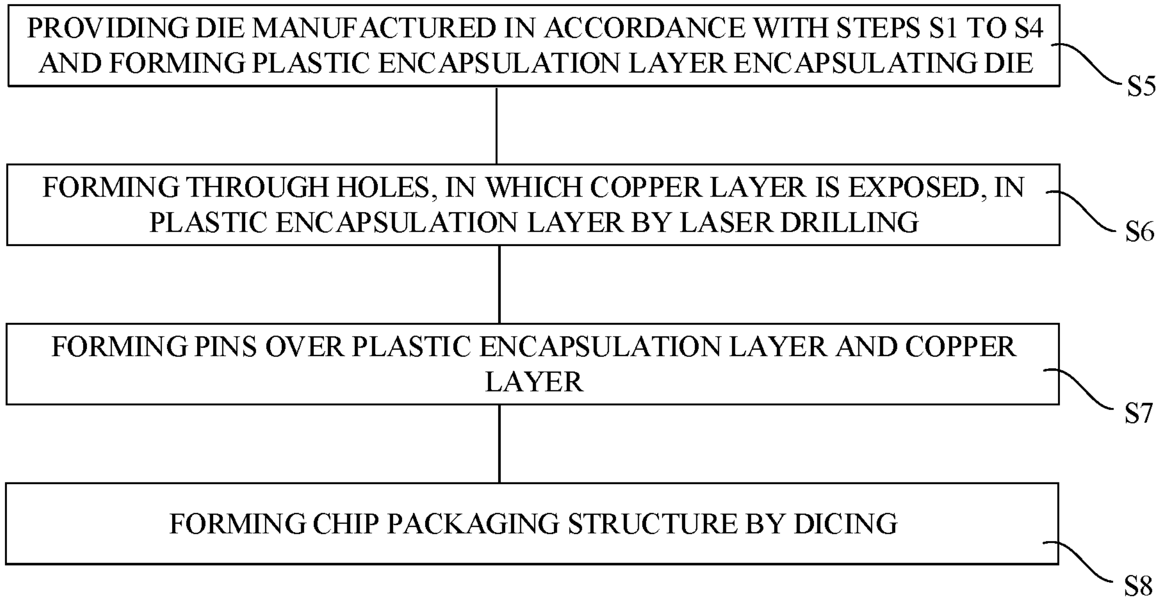
FIG. 8 shows a flow diagram of a manufacturing method for a chip packaging structure according to a second embodiment of the present disclosure.

FIG. 8 shows a flow diagram of a manufacturing method for a chip packaging structure according to a second embodiment of the present disclosure. FIGS. 9 to 13 are schematic diagrams of intermediate structures formed in the method of FIG. 8. FIG. 14 is a schematic cross-sectional diagram showing the structure of a chip packaging structure according to the second embodiment of the present disclosure.

Figure 9:
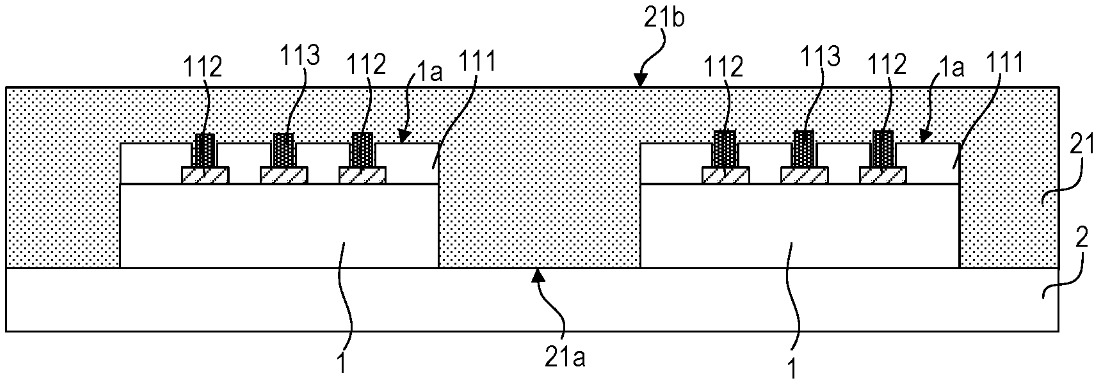
FIGS. 9 to 13 are schematic diagrams of intermediate structures formed in the method of FIG. 8.
Figure 10:
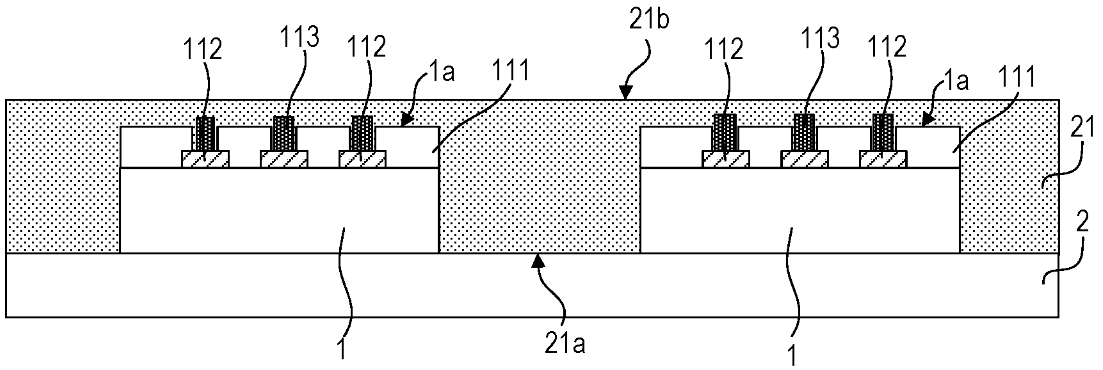

Reference is first made to step S5 shown in FIG. 8, as well as to FIGS. 9 and 10. A die 1 made in accordance with steps S1 to S4 shown in FIG. 1 is provided, and a plastic encapsulation layer 21 encapsulating the die 1 is formed.

In order for higher packaging efficiency to be achieved, in this step, a plurality of dies 1 may be provided in this step. The dies 1 may have either identical or different functions.

The dies 1 may be, for example, power dies, memory dies, sensor dies or radio-frequency dies, and this embodiment is not limited to any particular function of the dies 1.

In particular, the step of forming the plastic encapsulation layer 21 that encapsulates the dies 1 may include: referring to FIG. 9, fixing the dies 1 on a carrier substrate 2 in such a manner the active surfaces 1*a* of the dies 1 are away from the carrier substrate 2; and forming the plastic encapsulation layer 21 that encapsulates the dies 1 over a surface of the carrier substrate 2.

The carrier substrate 2 may be a hard plate. Examples of this may include glass plates, ceramic plates, metal plates, etc.

An adhesive layer may be disposed between the dies 1 and the carrier substrate 2 to enable the fixations of them. In particular, the adhesive layer may span the entire surface of the carrier substrate 2, and the dies 1 are placed on the adhesive layer. The adhesive layer may be formed of an easily strippable material, which allows easy removal of the carrier substrate 2. For example, it may be implemented as a thermally separable material that will lose its adhesiveness when heated, or an ultraviolet (UV) separable material that will lose its adhesiveness when irradiated by UV light.

The plastic encapsulation layer 21 may be formed of an epoxy resin, a polyimide resin, a benzocyclobutene resin, a polybenzoxazole resin, polybutylene terephthalate, polycarbonate, polyethylene terephthalate, polyethylene, polypropylene, polyolefin, polyurethane, polyolefin, polyethersulfone, polyamide, polyurethane, an ethylene-vinyl acetate copolymer, polyvinyl alcohol or another material. Alternatively, the plastic encapsulation layer 21 may also be formed of any of various other polymers, resins or polymeric composite materials. For example, it may be formed of a resin containing filler or glass fibers, or another material with similar properties. The capsulation may be accomplished by filling a liquid encapsulation material between the dies 1 and then curing the material in a mold at a high temperature. In some embodiments, the plastic encapsulation layer 21 may also be formed by a molding method suitable for plastic materials, such as thermal compression molding, transfer molding or the like.

The plastic encapsulation layer 21 may include a front side 21*a* and an opposing backside 21*b*.

Referring to FIG. 10, in order to allow the chip packaging structure to have a reduced thickness, the plastic encapsulation layer 21 may be thinned from the backside 21*b*. The thinning may be accomplished mechanically, for example, with a grinding wheel.

Figure 11:
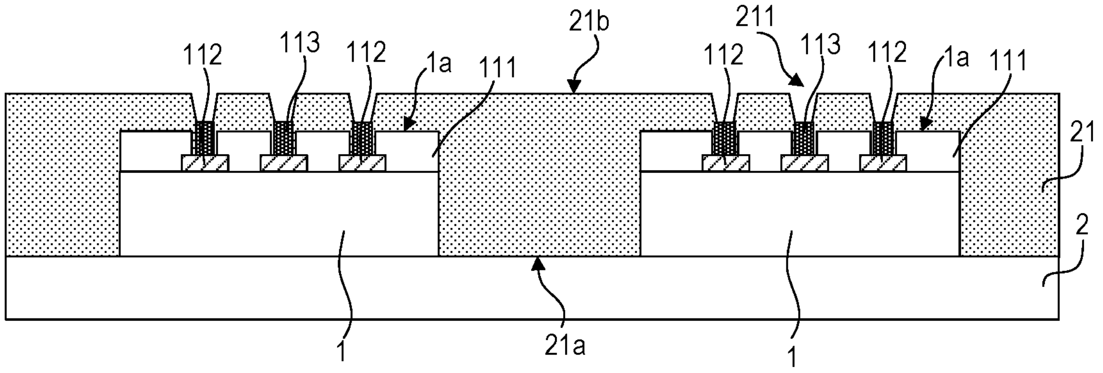

After that, referring to step S6 shown in FIG. 8, as well as to FIG. 11, through holes 211 in which the copper layer 113 is exposed may be formed in the plastic encapsulation layer 21 by laser drilling.

In the laser drilling process, in order to ensure complete exposure of the aluminum bonding pads 112 and thereby avoid open circuit due to residue of the plastic encapsulation layer 21 on the aluminum bonding pads 112, a high-power laser is generally selected. However, such high laser energy may cause perforation, and hence degraded electrical connection performance, of the aluminum bonding pads 112. In this embodiment, the copper layer 113 provided on the aluminum bonding pads 112 can prevent perforation of the aluminum bonding pads 112 by excessive laser energy. Moreover, the copper layer 113 can prevent surface oxidation of the aluminum bonding pads 112, which may lead to an increase in the electrical resistance of the aluminum bonding pads 112.

The copper layer 113 is preferred to be thick enough to prevent perforation of the aluminum bonding pads 112 during the laser drilling process.

The through holes 211 are sized smaller at the bottom than the copper layer 113. The through holes 211 are sized smaller at the bottom than at the top. In practical fabrication, the size of the through holes 211 at the bottom is generally greater than 75%, and generally not smaller than 60%, of that at the top.

Figure 12:
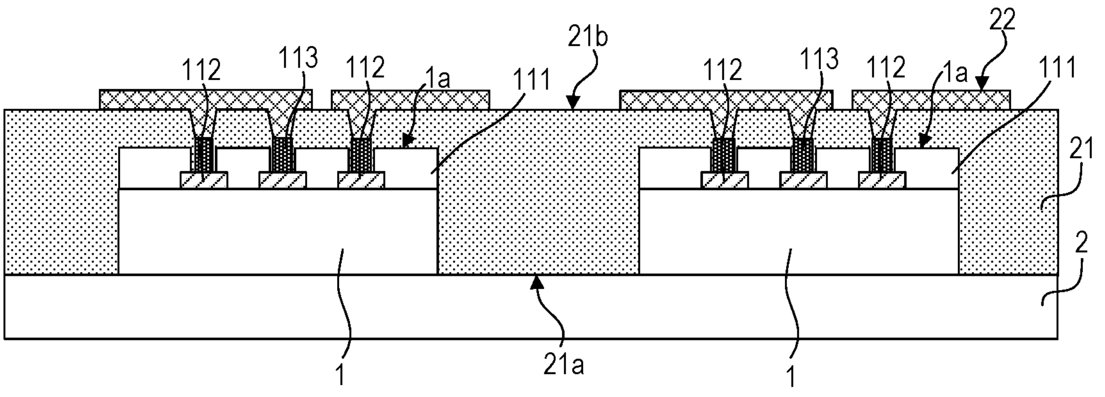

Afterwards, referring to step S7 shown in FIG. 8, as well as to FIG. 12, pins 22 are formed on the copper layer 113 of the plastic encapsulation layer 21.

In the present embodiment, the formation of the pins 22 include steps S71 to S74 below.

Step S71: Forming a photoresist layer over the copper layer 113 and the backside 21*b* of the plastic encapsulation layer 21.

In step S71, in one optional embodiment, the photoresist layer formed may be a photosensitive film. The photosensitive film may be torn from a tape and applied to the copper layer 113 and the backside 21*b* of the plastic encapsulation layer 21. In other optional embodiments, the photoresist layer may be formed by thermally curing applied liquid photoresist.

Step S72: Exposing and developing the photoresist layer so that a first predefined portion of the photoresist layer which is complementary to the pins 22 being fabricated is retained.

In step S72, the photoresist layer is patterned. In other optional embodiments, the photoresist layer may be replaced with another easily removable sacrificial material.

Step S73: Filling a metal layer in the portion that is complementary to the first predefined portion, resulting in the formation of the pins 22.

Step S73 may be accomplished using an electroplating process in which copper or aluminum is, for example, plated.

In particular, before the photoresist layer is formed in step S71, a seed layer may be formed over the copper layer 113 and the backside 21*b* of the plastic encapsulation layer 21 by physical or chemical vapor deposition. The seed layer may serve to supply power to the electroplating of copper or aluminum.

The electroplating process may be an electrolytic plating process or an electroless plating process. In the former case, with the object to be plated serving as a cathode, an electrolyte is electrolyzed to form a metal layer. In the latter case, metal ions in a solution are reduced and precipitate to form a metal layer on the object to be plated. In some embodiments, the pins 22 may be alternatively formed by sputtering and subsequent etching.

Step S74: Removing the remaining first predefined portion of the photoresist layer by ashing.

After the ashing, a portion of the seed layer corresponding to the first predefined region is removed using a dry or wet etching process.

Figure 13:
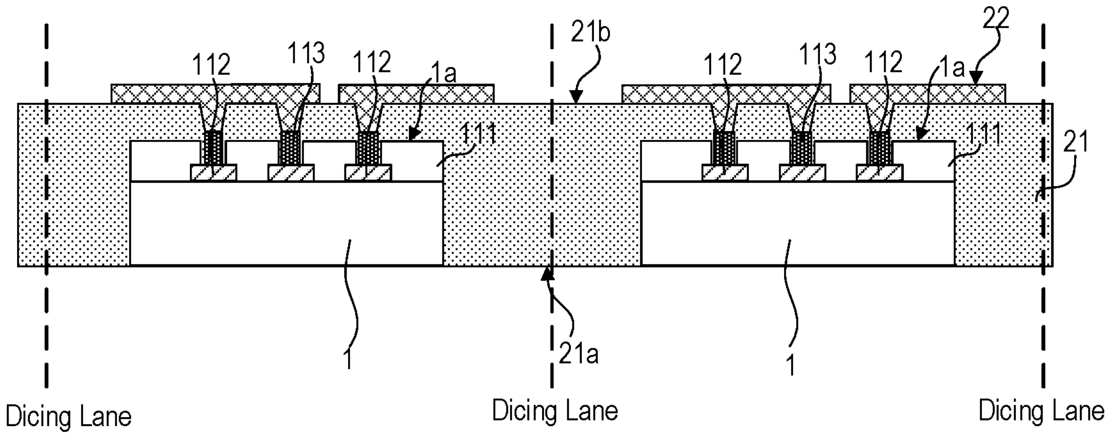
Figure 14:
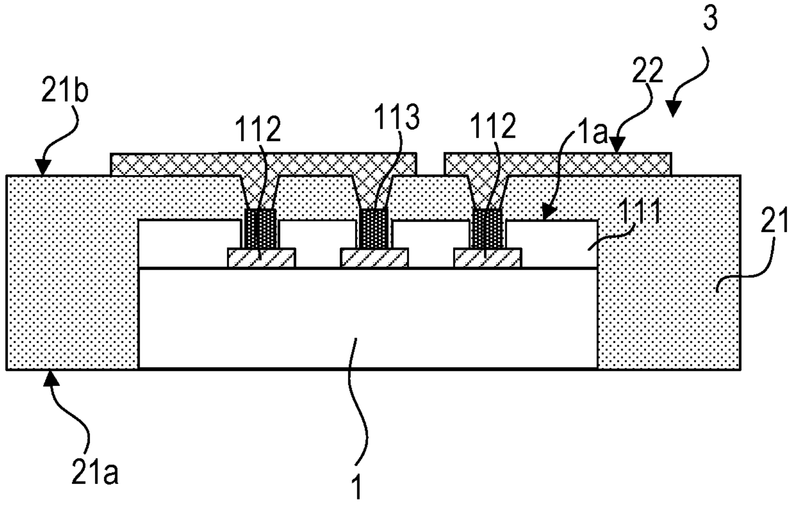
FIG. 14 is a schematic cross-sectional diagram showing the structure of a chip packaging structure according to the second embodiment of the present disclosure.

After that, referring to step S8 shown in FIG. 8, as well as to FIGS. 13 and 14, the chip packaging structure 3 is obtained by dicing.

Referring to FIG. 13, before the dicing, the carrier substrate 2 is removed.

The removal of the carrier substrate 2 may be accomplished, for example, by laser lift-off or UV irradiation.

Referring to FIG. 14, in case of several dies 1 being encapsulated by the plastic encapsulation layer 21, as a result of the dicing, each chip packaging structure 3 contains one die 1.

Referring to FIG. 14, in this embodiment, such a chip packaging structure 3 includes:

the die 1;

the plastic encapsulation layer 21 encapsulating the die 1;

the pins 22 on the plastic encapsulation layer 21, the pins 22 filling the through holes 211 in the plastic encapsulation layer 21 so as to be connected to the copper layer 113.

Figure 15:
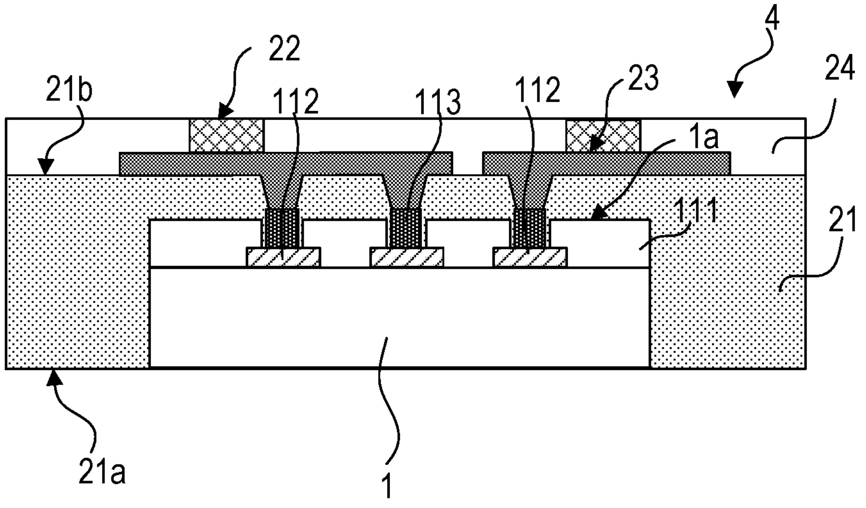
FIG. 15 is a schematic cross-sectional diagram showing the structure of a chip packaging structure according to a third embodiment of the present disclosure.

FIG. 15 is a schematic cross-sectional diagram showing the structure of a chip packaging structure according to a third embodiment of the present disclosure. Referring to FIG. 15, the chip packaging structure 4 according to this embodiment is substantially the same as the chip packaging structure 3 shown in FIG. 14, except that the chip packaging structure 4 of FIG. 15 further includes a rewiring layer 23 on the plastic encapsulation layer 21. The rewiring layer 23 is filled in the through holes 211 in the plastic encapsulation layer 21 so as to be electrically connected to the copper layer 113. The pins 22 are on the rewiring layer 23.

The rewiring layer 23 may be selectively electrically connected to some of the aluminum bonding pads 112 by the copper layer 113. This enables a more complex circuit layout.

The rewiring layer 23 and the pins 22 may be encapsulated by a dielectric layer 24 in such a manner that the pins 22 are exposed from the dielectric layer 24.

In some embodiments, two or more such rewiring layers 23 may be included.

Figure 16:
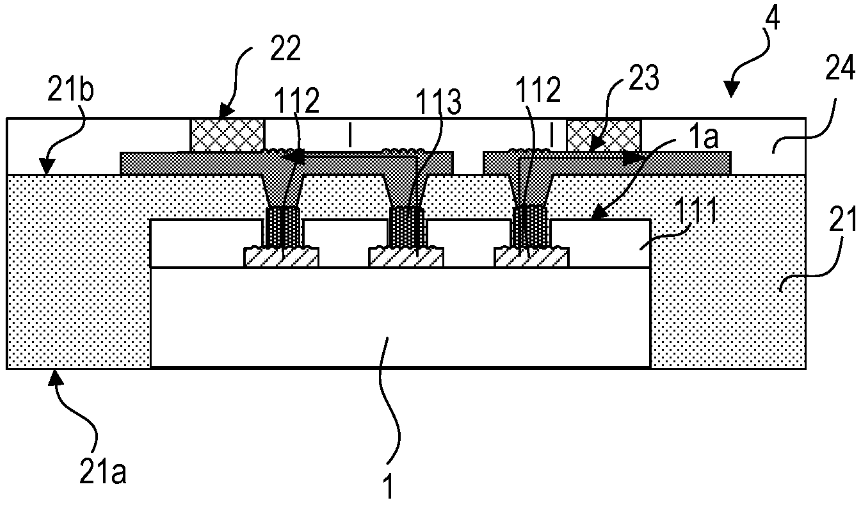
FIG. 16 is a schematic cross-sectional diagram showing the structure of a comparative chip packaging structure.

FIG. 16 is a schematic cross-sectional diagram showing the structure of a comparative chip packaging structure. It is to be noted that if the die 1 in the chip packaging structure 4 includes a high-frequency device, a skin effect will be caused by a current when the device is operating a high frequency. If the top surfaces of the aluminum bonding pads 112 are rough, when directly formed on the aluminum bonding pads 112, the copper layer 113 will also have a rough top surface. In this case, portions of the rewiring layer 23 aligned with the copper layer 113 will also have a rough surface. When a current I flows through the rewiring layer 23 with such a rough surface, more energy will be consumed.

Referring to FIG. 15, if the rough surfaces of the aluminum bonding pads 112 are flattened prior to the formation of the copper layer 113, then the resulting copper layer 113 will have a flat top surface. As a result, the portions of the rewiring layer 23 aligned with the copper layer 113 will also have a flat surface. In this way, less energy will be consumed when the current I flows through the flat surface of the rewiring layer 23.

The flattening may be accomplished by forming a zinc layer using the solution b) as described above in the electroless plating process.

Accordingly, a manufacturing method for a chip packaging structure according to this embodiment differs from that of FIG. 8 in that, before the pins 22 are formed in step S7, forming a rewiring layer 23 on the plastic encapsulation layer 21 and the copper layer 113; and forming pins 22 on the rewiring layer 23.

The rewiring layer 23 may be formed using a similar process as used to form the pins 22.

Although the present disclosure has been described above, it is in no way limited to the foregoing description. Any person skilled in the art can make various changes and modifications without departing from the spirit and scope of the present disclosure. Accordingly, the scope of protection of the present disclosure is intended to be defined by the appended claims.

What is claimed is:

1. A manufacturing method for a die, comprising:

providing a wafer, the wafer comprising a passivation layer and a plurality of aluminum bonding pads, the passivation layer and the plurality of aluminum bonding pads arranged on an active surface of the wafer, the passivation layer having a plurality of first openings in which the aluminum bonding pads are partially exposed;

forming a patterned mask layer over the passivation layer and the plurality of aluminum bonding pads, the patterned mask layer having second openings in which the aluminum bonding pads are partially exposed, the patterned mask layer completely covering the passivation layer;

removing an oxide layer from the aluminum bonding pads, forming a copper layer in the second openings and removing the patterned mask layer; wherein the copper layer is formed in the second openings by electroless plating, wherein the electroless plating comprises: first forming an electrolessly plated zinc layer in the second openings; and forming the copper layer by displacement of the zinc layer with copper ions in a solution; and dicing the wafer into a plurality of dies.

2. The manufacturing method for a die according to claim 1, wherein a distance between a boundary of the copper layer and the passivation layer at a boundary of the first openings ranges from 3 μm to 10 μm.

3. The manufacturing method for a die according to claim 1, wherein the patterned mask layer is formed of a photosensitive film, and wherein before the patterned mask layer is formed, the passivation layer is bombarded by oxygen plasma or argon plasma.

4. The manufacturing method for a die according to claim 1, wherein the oxide layer on the aluminum bonding pads is removed by micro-etching.

5. A manufacturing method for a chip packaging structure, comprising:

providing a die manufactured in accordance with claim 1 and forming a plastic encapsulation layer encapsulating the die;

forming a through hole, in which the copper layer is exposed, in the plastic encapsulation layer by laser drilling;

forming a pin over the plastic encapsulation layer and the copper layer; and forming the chip packaging structure by dicing.

6. The manufacturing method for a chip packaging structure according to claim 5, wherein the formed plastic encapsulation layer encapsulates a plurality of the dies, and wherein the dicing is performed so that the chip packaging structure each comprises one of the dies.

7. The manufacturing method for a chip packaging structure according to claim 5, wherein before the pin is formed, a rewiring layer is formed over the plastic encapsulation layer and the copper layer, and wherein the pin is formed on the rewiring layer.

8. The manufacturing method for a chip packaging structure according to claim 5, wherein the through hole has a bottom sized smaller than the copper layer, and wherein the bottom of the through hole is sized smaller than at a top of the through hole.

* * * * *